United States Patent
Xing (10) Patent No.: US 6,519,157 B1
(45) Date of Patent: Feb. 11, 2003

(54) SYSTEM AND METHOD FOR MOUNTING A STACK-UP STRUCTURE

(75) Inventor: Andrew Xing, Bothell, WA (US)

(73) Assignee: nLight Photonics Corporation, Vancouver, WA (US)

( * ) Notice: Subject to any disclaimer, the term of this patent is extended or adjusted under 35 U.S.C. 154(b) by 0 days.

(21) Appl. No.: 10/004,253

(22) Filed: Oct. 23, 2001

(51) Int. Cl.⁷ .................................. H05K 7/20
(52) U.S. Cl. ................ 361/704; 361/707; 361/719; 361/720; 361/721; 361/784; 361/790; 361/803; 174/252; 174/255; 257/706; 257/712; 257/718; 165/80.2; 165/185; 428/901; 438/54
(58) Field of Search ................ 361/704, 707, 361/709, 710, 712–721; 257/706, 712, 718, 719, 727; 165/80.2, 185, 80.3; 62/3.2, 3.6, 3.7; 438/54; 428/901; 174/252, 255

(56) References Cited

U.S. PATENT DOCUMENTS

| | | | |
|---|---|---|---|
| 3,952,231 A | * | 4/1976 | Davidson et al. ............ 361/717 |
| 4,811,166 A | * | 3/1989 | Alvarez et al. ............. 361/717 |
| 5,637,921 A | * | 6/1997 | Burward-Hoy ............. 257/712 |
| 5,740,016 A | * | 4/1998 | Dhindsa ..................... 361/704 |
| 5,813,233 A | * | 9/1998 | Okuda et al. .................. 62/3.7 |
| 5,898,575 A | * | 4/1999 | Hawthorne et al. ......... 361/809 |
| 5,917,709 A | * | 6/1999 | Johnson et al. ............. 361/803 |
| 6,043,982 A | * | 3/2000 | Meissner ..................... 361/704 |
| 6,088,228 A | * | 7/2000 | Petersen et al. ............. 361/720 |
| 6,181,561 B1 | * | 1/2001 | Albrecht et al. ............. 361/719 |
| 6,191,477 B1 | * | 2/2001 | Hashemi ..................... 257/706 |
| 6,335,491 B1 | * | 1/2002 | Alagaratnam et al. ....... 174/260 |
| 6,347,042 B1 | * | 2/2002 | White .......................... 361/784 |
| 6,391,676 B1 | * | 5/2002 | Tsuzaki et al. ............... 438/54 |
| 6,399,892 B1 | * | 6/2002 | Milkovich et al. .......... 174/258 |

OTHER PUBLICATIONS

U.S. patent application Ser. No. 09/929,837, Farmer et al., filed Aug. 13, 2001.
U.S. patent application Ser. No. 09/929,382, Farmer et al., filed Aug. 13, 2001.

* cited by examiner

*Primary Examiner*—Boris Chervinsky
(74) *Attorney, Agent, or Firm*—Fulbright & Jaworski L.L.P.

(57) ABSTRACT

Disclosed are systems and methods which utilize mounting members adapted to provide consistent compressive pressure with respect to strata of a laminated structure, such as the heat source, TEC, and heat absorbing layers of a TEC stack-up, throughout a range of operating temperatures. Preferably, mounting members of the present invention are adapted to provide uniform compressive pressure across a surface area, such as the heat transferring surfaces of a TEC, to thereby provide a sound structure which is relatively resistant to dynamic forces. Preferred embodiment mounting members are adapted to minimize the transfer of thermal energy therethrough, such as to substantially avoid a heat leak in a TEC stack-up configuration.

56 Claims, 2 Drawing Sheets

SYSTEM AND METHOD FOR MOUNTING A STACK-UP STRUCTURE

CROSS-REFERENCE TO RELATED APPLICATIONS

The present invention is related to and claims the benefit of priority to commonly assigned and co-pending U.S. provisional patent application serial No. 60/316,811, entitled "SYSTEM AND METHOD FOR MOUNTING A STACK-UP STRUCTURE." The present application is also related to commonly assigned and co-pending U.S. patent applications Ser. No. 09/929,837 entitled "SYSTEM AND METHOD FOR OPTIMIZING THE PERFORMANCE OF A MULTIPLE GAIN ELEMENT LASER," filed Aug. 13, 2001, and Ser. No.09/929,382 entitled "IBC LASER with Optimized Fiber Output Coupler," filed Aug. 13, 2001, the disclosures of which are hereby incorporated herein by reference.

TECHNICAL FIELD OF THE INVENTION

The invention relates generally to mounting system components and, more particularly, to mounting techniques to provide a desired structural condition of components through a range of operating temperatures.

BACKGROUND OF THE INVENTION

Thermoelectric cooling devices (TEC) are well known in the art for removing heat generated from components, such as for removing heat from particular electronic components of a system. Specifically, solid state materials, such as bismath-telluride ($Bi_2Te_3$), may be provided a direct current to provide automatic temperature control, in accordance with the Peltier effect, to components in communication therewith.

For example, a TEC "stack-up" may be made in which a heat source component, such as may be a single component or a number of components disposed on a shared carrier, for which temperature control is desired is placed in contact with the cold side of a TEC and a heat absorbing or dissipating component, such as a heat sink or cold plate, is placed in contact with the hot side of the TEC. In order to ensure reliability of the TEC over a wide range of environmental conditions, it is desirable to maintain "gentle" compression to TEC elements. Specifically, the TEC elements are generally fragile under tension, and are stronger under compression, and therefore, a compression interface may be useful therewith to ensure good thermal interface in the stack-up. For example, a screw or similar fastener may be engaged in an orifice of the heat source component and the heat absorbing component to apply a compressive force to the TEC stack-up. Similarly, various types of clips may be engaged along an edge of the heat source component and the heat absorbing component to apply a compressive force to the TEC stack-up.

It should be appreciated, however, that the use of TECs is not without problems. For example, in order to provide uniform temperature control across a heat source component in contact with a single TEC and to ensure TEC reliability, a substantially uniform and constant compressive force should be maintained across the interface between the heat source component and the TEC and the heat absorbing component and the TEC. However, the use of fasteners and clips in the prior art has often resulted in nonuniform and/or varying compressive forces being applied, such as throughout a range of operating temperatures. For example, Bellcore sets forth performance criteria for systems utilized in the telecommunications industry requiring such systems to perform reliably throughout a wide range of operating temperatures, such as from −40° C. to +125° C., in which simple fastening systems of the prior art used with respect to heat source components comprising more than a single component or relatively small multiple component configuration will experience nonuniform and/or widely varying compressive forces.

Moreover, fasteners and clips utilized in the past are a source of heat leaking between the TEC cold surface and the TEC hot surface. Specifically, when conventional methods are utilized in providing clamping force to the TEC stack-up, a heat path is created from the hot side of the TEC to the cold side of the TEC resulting in a thermal loop. This thermal loop impinges on the TEC's efficiency, thus reducing its usefulness in providing automatic temperature control with respect to the heat source component and/or heat absorbing component.

It should be appreciated that TECs are generally not structural elements. Specifically, although providing good compression characteristics, TECs generally are relatively weak with respect to tension or shear forces. Although such structural attributes are often acceptable when heat source and/or heat absorbing components exhibit a relatively small footprint, heat source and/or heat absorbing components having a relatively large foot print can result in excessive tension and/or shear forces being applied to a corresponding TEC of a TEC stack-up. For example, a relatively small TEC may be coupled to a heat source component having a relatively large footprint, such as an incoherently beam combined (IBC) LASER system, to provide cooling with respect to a localized source of heat. Accordingly, the heat source component may extend appreciably beyond the corresponding surface of the TEC, thereby resulting in tension and/or shear forces being exerted upon the TEC if a proper mounting configuration is not adopted and/or if uniform one predicted comparison is not maintained.

Moreover, the aforementioned performance criteria set forth by Bellcore with respect to systems utilized in the telecommunications industry may require such systems to perform reliably when exposed to dynamic forces, such as those of a physical shock and/or vibration. However, the center of gravity of the above described relatively large footprint heat source component may not correspond with the center of the TEC, further resulting in tension and/or shear forces when exposed to dynamic forces.

Accordingly, a need exists in the art for systems and methods which provide mounting structures for use with TEC stack-up configurations which provide substantially uniform and constant compression between the strata thereof, such as throughout a relatively wide range of operating temperatures. A further need exists in the art for such systems and methods to minimize heat leak such that a thermal loop is substantially minimized.

A still further need in the art exists for systems and methods which provide mounting structures for use with TEC stack-up configurations which provides a stable structural element adapted to withstand expected dynamic forces, such as those associated with a predicted level of physical shock and/or vibration. A further need exists in the art for such systems and methods to accommodate a relatively large disparity in footprint sizes of the strata thereof.

BRIEF SUMMARY OF THE INVENTION

The present invention is directed to systems and methods which utilize mounting members adapted to provide consistent and/or predictable interfacing forces with respect to strata of a laminated structure, such as the heat source, TEC, and heat absorbing layers of a TEC stack-up, throughout a range of operating temperatures. Preferably, mounting members of the present invention are adapted to provide uniform compressive pressure across a surface area, particularly the Peltier elements of a TEC, to thereby provide a sound structure which is relatively resistant to dynamic forces and environmental variations. Preferred embodiment mounting members are adapted to minimize the transfer of thermal energy therethrough, such as to substantially minimize heat leak in a TEC stack-up configuration.

A preferred embodiment of the present invention utilizes a mounting member comprised of a material selected at least in part as a function of its coefficient of thermal expansion (CTE). According to a most preferred embodiment, a material from which a mounting member of the present invention is made is selected to have a CTE slightly higher than that of the effective CTE of a structure for which the mounting member is used to provide a compressive mount. For example, where a mounting member of the present invention is utilized in providing mounting of a TEC stack-up, the CTE of the mounting member is preferably selected to be slightly higher than the effective CTE of a corresponding portion of the TEC stack-up. That is, the CTE of a mounting member of the present invention is preferably selected to be slightly higher than that associated with the combination of materials utilized in the TEC stack-up between the points at which the mounting members are affixed to the TEC stack-up.

According to a preferred embodiment, mounting members of the present invention are fixed to a structure for which the mounting member is used to provide a compressive mount at a temperature outside of an expected range of temperatures associated with the expected operation of the structure. For example, mounting members of the present invention may be soldered, or otherwise substantially rigidly affixed, to components of a TEC stack-up while the entire structure is maintained at a temperature greater than the highest expected operating temperature of the structure. According to a most preferred embodiment, where the CTE of the mounting members is slightly higher than the effective CTE of the structure, a relatively constant "gentle" compressive force is maintained with respect to the structure throughout the operating temperature range after using the aforementioned higher mounting temperature.

Mounting members of the present invention are preferably adapted to provide structural support to a structure for which the mounting member is used to provide compressive mounting. For example, mounting members of the present invention may be provided with a relatively large diameter to thereby provide compressive, shear, and/or tensile strength to the completed structure.

Additionally or alternatively, mounting members of the present invention may be adapted to minimize stress associated with an interface between the mounting member itself and the structure to which it is mounted. For example, preferred embodiments of the present invention include expansion scores or cuts disposed at predetermined positions therein.

Preferred embodiment mounting members are adapted to minimize the conductance of thermal energy therethrough. Accordingly, the cross-sectional area of mounting members of the present invention is preferably minimized. For example, a most preferred embodiment of the present invention comprises a hollow cylinder to provide structural strength with minimum thermal conductance.

Accordingly, a technical advantage of the present invention is that mounting members of the invention may be used with structures, such as TEC stack-up configurations, to provide substantially uniform and constant compressive communication between strata thereof, such as throughout a relatively wide range of operating temperatures. A further technical advantage of preferred embodiments of the invention is that mounting members may be relied upon to provide structural integrity while minimizing conductance of thermal energy.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWING

For a more complete understanding of the present invention, reference is now made to the following descriptions taken in conjunction with the accompanying drawing, in which.

DETAILED DESCRIPTION

Figure 1:
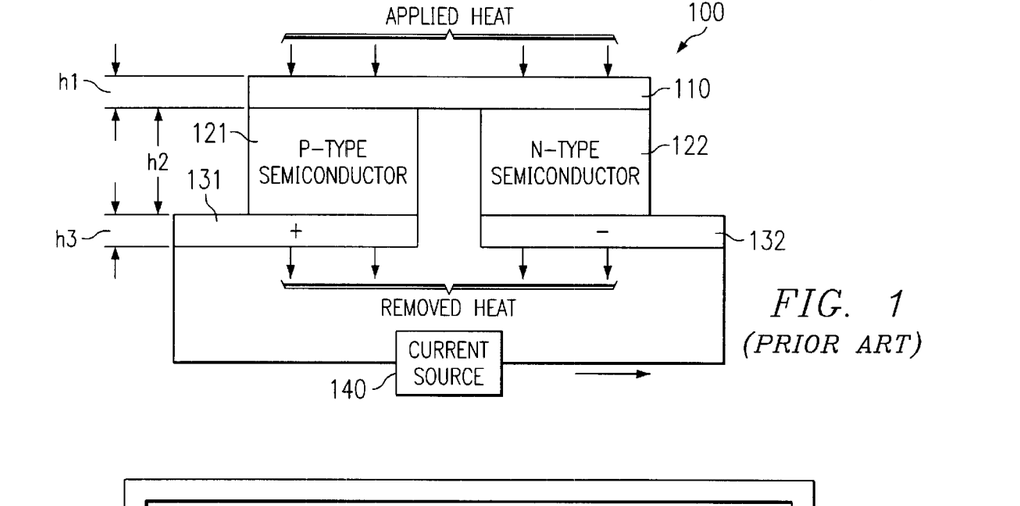
FIG. 1 shows an embodiment of a thermoelectric cooler as is known in the prior art.

Directing attention to FIG. 1, a typical configuration of a thermoelectric cooler (TEC) device as is well known in the art is shown generally as TEC 100. Thermoelectric cooling devices such as TEC 110 (whether deployed in configuration as a single TEC or multiple TECs) are well known in the art for providing abstraction of heat from components, such as for removing heat from particular electronic components of a system. Specifically, in a typical TEC configuration as illustrated, solid state material 121 and 122, such as may comprise bismuth-telluride ($Bi_2Te_3$), may be disposed between conductive plates 110, 131, and 132, such as may comprise alumina ($Al_2O_3$), aluminum-nitride (e.g., AlN), etcetera. Current source 140 may be coupled to conductive plates 131 and 132 to provide a current through solid state material 121 and 122 for heat transfer according to the Peltier effect. Accordingly, provided a difference in temperature exists between the ambient temperatures at plate 110 and plates 131 and 132, heat applied to plate 110 is transferred by TEC 110 to plates 131 and 132 to thereby provide thermoelectric cooling to components placed in contact with plate 110.

A TEC "stack-up" may be made in which a heat source component, such as may be a single component or a number of components, for which temperature control is desired is placed in contact with a TEC "cold side," such as a surface of plate 110, and a heat absorbing or dissipating component, such as a heat sink, cold plate, etc., is placed in contact with a TEC "hot side," such as a surface of plates 131 and 132. One such TEC stack-up is shown in FIGS. 2A and 2B as TEC stack-up 200, where FIG. 2A shows a plan view of TEC stack-up 200 and FIG. 2B shows a cross-section elevation view thereof.

Figure 2A:
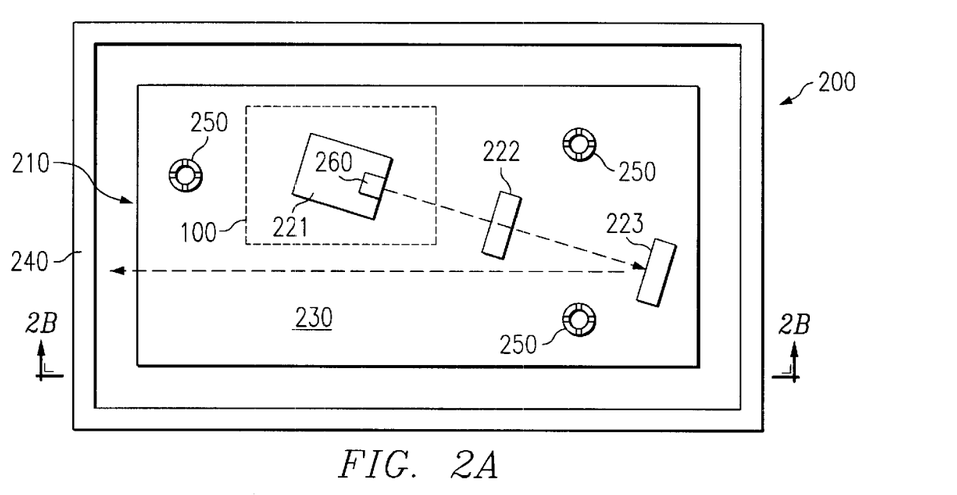
FIG. 2A shows a plan view of a component stack-up including mounting members of the present invention.
Figure 2B:
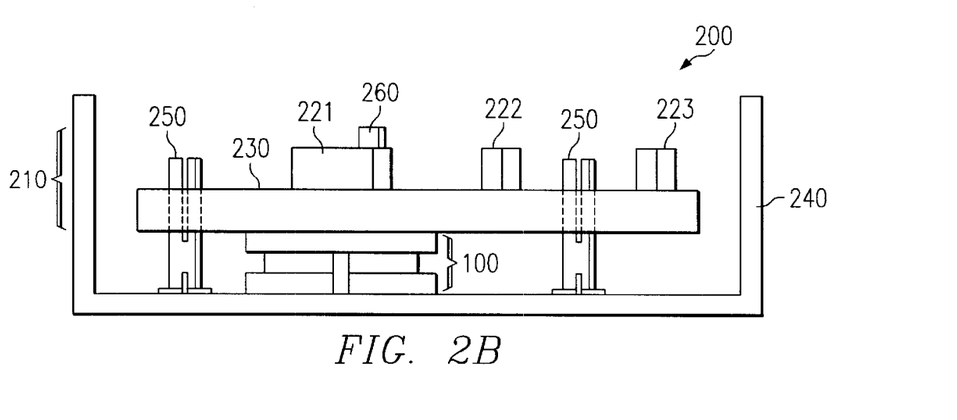
FIG. 2B shows a cross-section elevation view of the component stack-up of FIG. 2A.

TEC stack-up 200 of FIGS. 2A and 2B includes TEC 110 disposed between heat source component 210 and heat absorbing component 240. Heat absorbing component 240 of the illustrated embodiment is preferably an assembly or sub-assembly case element, such as may be made of metal or other heat conductive material, to thereby provide absorption/dissipation of heat. However, it should be appreciated that heat absorbing component 240 may comprise any number of components, including a case element, a heat sink, a system component operable at a temperature less than that of heat source component 210, and/or combinations thereof, if desired.

As can be appreciated from the illustrations of FIGS. 2A and 2B, heat source component 210 may comprise a plurality of individual components. Specifically, heat source component 210 of the illustrated embodiment includes individual system components 221–223 disposed on shared carrier 230. According to a preferred embodiment, heat source component 210 comprises an incoherently beam combined (IBC) LASER emitter subassembly. Accordingly, component 221 may comprise a LASER diode array (e.g., component 260, which is the main heat source), component 222 may comprise a field lens, component 223 may comprise a reflective grating, and shared carrier 230 may comprise a rigid mounting structure. Various configurations of such IBC LASERs are shown and described in the above referenced patent applications entitled "IBC LASER with Optimized Fabry-Perot Coatings" and "IBC LASER with Optimized Fiber Output Coupler."

It should be appreciated that heat source component 210 may have areas associated with relatively high levels of heat which may be benefited by the use of a TEC or other cooling technique while other areas of heat source component 210 are associated with relatively low levels of heat. For example, in the above described embodiment, where heat source component 210 comprises an IBC LASER, component 221 may provide a significant source of heat while components 222 and 223 do not. Accordingly, TEC 110 is preferably disposed in TEC stack-up 200 to correspond to areas of heat source component 210 having excessive heat associated therewith.

Figure 3A:
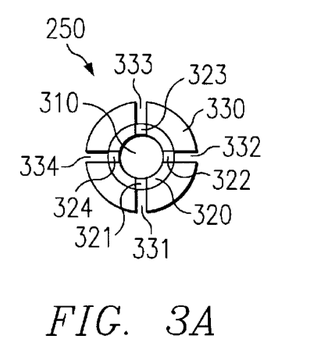
FIG. 3A shows a plan view from the top of a preferred embodiment of a mounting member of the present invention.
Figure 3B:
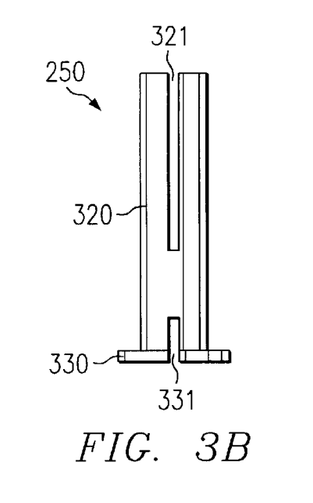
FIG. 3B shows a front elevation view of a preferred embodiment of a mounting member of the present invention.
Figure 3C:
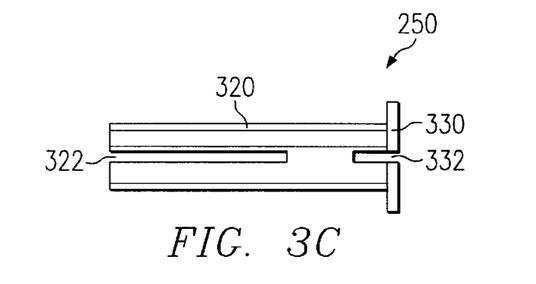
FIG. 3C shows a left elevation view of a preferred embodiment of a mounting member of the present invention.
Figure 3D:
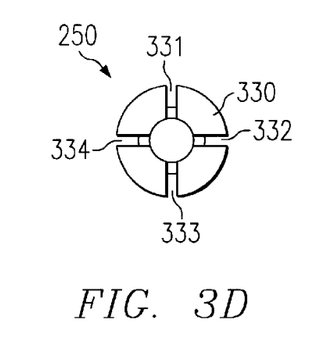
FIG. 3D shows a plan view from the bottom of a preferred embodiment of a mounting member of the present invention.

TEC stack-up 200 preferably includes mounting members 250 of the present invention disposed to provide uniform and predictable interfacing between the strata thereof. Directing attention to FIGS. 3A–3D, a preferred embodiment mounting member 250 is shown in detail. Specifically, FIG. 3A shows a plan view from the top of a preferred embodiment of mounting member 250 and FIG. 3D shows a corresponding plan view from the bottom. FIG. 3B shows a front elevation view of a preferred embodiment of mounting member 250 and FIG. 3C shows a corresponding left elevation view. As shown in FIGS. 3A–3D, a preferred embodiment of mounting member 250 includes body 320 and base 330.

Preferably, mounting members 250 are disposed at predetermined positions to minimize or eliminate stress experienced by the Peltier elements of TEC stack-up 200, such as may be associated with physical shock to and/or vibration of TEC stack-up 200. For example, performance criteria for components to be deployed in telecommunications applications set forth by Bellcore may require such systems to perform reliably when exposed to relatively aggressive dynamic forces, such as those of a physical shock and/or vibration. However, TECs such as TEC 100 are generally not configured to withstand substantial shear and/or tensile forces. Moreover, the illustrated embodiment of heat source component 210 is relatively large as compared to TEC 100 and, therefore, may result in substantial shear and/or tensile forces being applied to various portions of TEC 110 in a vibration or shock situation. For example, heat source component 210 may be on the order of 118 mm by 52 mm, in the case of an IBC LASER implementation, while TEC 110 is on the order of 30 mm by 30 mm.

Accordingly, the number of mounting members 250 and/or the locations associated with mounting members 250 within TEC stack-up 200 are preferably determined to present uniform interfacing of heat source component 210 with TEC 110, such as may withstand dynamic forces of a physical shock and/or vibration. For example, a preferred embodiment of the present invention selects locations of mounting members 250 with reference to the center of gravity of heat source component 210, or portions thereof, in order to assure uniform stresses across the interface of heat source component 210 and TEC 110. According to a preferred embodiment, each of mounting members 250 is disposed at a point substantially corresponding to a center of gravity with respect to an associated portion of heat source component 210 cantilevered beyond TEC 100. In such an embodiment, TEC 100 is preferably disposed to substantially be centered with respect to a center of gravity point associated with the portion of heat source component 210 directly interfaced therewith.

Mounting members 250 are preferably adapted to provide structural strength to the resulting stack-up. Preferred embodiments of mounting member 250 provide a relatively large cross-sectional diameter to result in a mounting member suitable for withstanding not only compressive forces but also lateral or shear forces. For example, a preferred embodiment mounting member utilized in a TEC stack-up including a relatively large IBC LASER heat source component may have a body outside diameter in the range of approximately 3–6 mm (e.g., according to a preferred embodiment, the outside diameter of body 320 may be approximately 4 mm). It should be understood that use of the term "diameter" is intended to include a chord passing through a center of a shape, whether that shape is a circle, square, triangle, oval, or any other of a number of shapes suitable for providing structural strength as described herein.

Additionally, embodiments of mounting member 250 provide a relatively large footprint, where a surface interface is utilized, to provide sufficient resistance to expected stress forces when attached to a surface of stack-up 210. For example, a preferred embodiment mounting member utilized in a TEC stack-up including a relatively large IBC LASER heat source component may have a base outside diameter in the range of approximately 5–7 mm (e.g., according to a preferred embodiment, the outside diameter of base 330 may be approximately 6 mm).

According to a preferred embodiment, mounting member 250 may be coupled to a component of the stack-up structure by being affixed (such as by using solder, epoxy, or other adhesion agents), such as at base 330, to a component surface as shown in FIGS. 2A and 2B. Additionally or alternatively, preferred embodiments of mounting member 250 may be coupled, such as at body 320, to a component of the stack-up structure by being passed through an orifice thereof as shown in FIGS. 2A and 2B. Although a preferred embodiment is illustrated herein using both a base attachment and a pass through attachment, there is no such limitation to the present invention. For example, an alternative embodiment of the present invention may utilize a pass through attachment at heat absorbing component 240 in addition to the pass through attachment at heat source component 210, if desired. Similarly, an alternative embodiment of the present invention may utilize a surface attachment at heat source component 210 in addition to the surface attachment at heat absorbing component 240, if desired.

Figure 4:
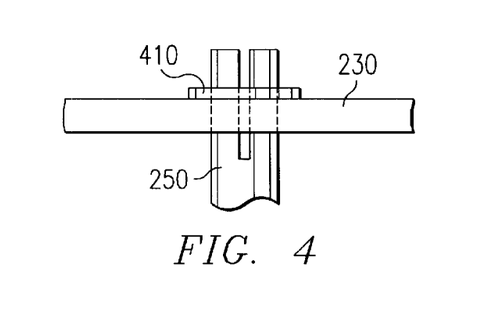
FIG. 4 shows a mounting member attachment technique employing an attachment member according to an embodiment of the present invention.

Attachment techniques other than those illustrated in FIGS. 2A and 2B may additionally or alternatively be used according to the present invention, if desired. For example, directing attention to FIG. 4, a mounting member attachment technique employing an attachment member is shown. Specifically, attachment member 410, such as may be a ring sized to provide a mounting collar for the illustrated embodiment of mounting member 250, is shown deployed in communication with a surface of shared carrier 230. In operation, mounting member 250 may be passed through an orifice of shared carrier 230, attachment member 410 slid over the exposed end of mounting member 250, and attachment member 410 affixed to mounting member 250, such as by soldering or application of epoxy. Attachment member 410 and/or mounting member 250 may be affixed to shared carrier 230, depending upon the desired attributes of the interface. By selecting appropriate material for member 410, the heat coupled from 240 to 230 is reduced substantially because the heat path is extended by member 410.

Preferred embodiments of the mounting member include an expansion score to minimize or otherwise relieve stress associated with the interface between the mounting member and the component to which it is attached. There may be a mismatch in thermal expansion between a mounting member of the present invention, the material of an element it is interfaced with, and a material used in affixing it to an element causing stress to be experienced. For example, in the illustrated embodiment, mounting member 250 is interfaced with shared carrier 230 by passing through an orifice therein and being affixed thereto, such as using solder, which may cause stresses on shared carrier 230 at this interface as operating temperatures change. The larger the area of interface, the larger the stresses are likely to be.

Accordingly, mounting member 250 may preferably include a plurality of cuts in the distal end of body 320, as shown by cuts 321–324 of FIGS. 3A–3D, to localize and reduce stresses experienced at an interface. Additionally or alternatively, mounting member 250 may preferably include a plurality of cuts in base 330 and/or base end of body 320, as shown by cuts 331–334 of FIGS. 3A–3D.

Cuts 321–324 are preferably sized to allow for expansion and/or contraction of either or both of body 320 and shared carrier 230, such as may be experienced throughout an expected range of operating temperatures. Similarly, cuts 331–334 are preferably sized to allow for expansion and/or contraction of any or all of body 320, base 330, and heat absorbing component 240, such as may be experienced throughout an expected range of operating temperatures.

To ensure cuts 321–324 accommodate expansion and/or contraction while transferring a minimum of stress to the interface between mounting member 250 and heat source component 210, cuts 321–324 of the preferred embodiment are sized to extend the full length of the interface between mounting member 250 and heat source component 210. As shown in FIG. 2B, a most preferred embodiment of cuts 321–324 may extend slightly beyond the interface, and preferably beyond any adhesion agent (e.g., solder, epoxy, etc.) used therewith, to more readily accommodate relative movement of particular components with a minimum of corresponding stress. Similarly, cuts 331–334 are preferably sized to extend the full extent of base 330, and preferably beyond any adhesion agent used therewith.

Although the illustrated embodiment shows 4 equally spaced scores in body 320 and 4 equally spaced scores in base 330, there is no limitation of the present invention to such an arrangement. For example, more or fewer such scores may be utilized with respect to any portion of a mounting member according to the present invention. Additionally or alternatively, scores utilized according to the present invention may be non-uniformly spaced, such as to correspond with an area of highest stress or to correspond with a temperature gradient. It should be appreciated that scores utilized according to the present invention need not completely extend through body 320 and instead may be embodied as channels in a surface of body 320 where it is determined that such a configuration provides adequate stress relief according to the present invention.

Mounting members 250 are preferably adapted to minimize the transfer of thermal energy therethrough. The transfer of thermal energy, or heat leak, through an element, such as mounting members 250 of the present invention, can generally be described by the equation:

$$Q=(K \cdot A \cdot \Delta T)/D$$

where Q is the heat leak, K is the thermal conductivity of the material from which the element is made, A is the cross-sectional area of the material comprising the element, $\Delta T$ is the difference in temperature across the element, and D is the distance across the element the difference in temperature exists. It can be appreciated from the above equation that heat leak (Q) may be minimized by decreasing the thermal conductivity of the material used, decreasing the cross-sectional area of the material, and/or increasing the distance between the thermal transfer points (it being presumed that the actual temperatures of the thermal transfer points are substantially beyond the control of the designer in many of the implementations of the present invention).

Accordingly, preferred embodiments of mounting members 250 provide a relatively small cross-sectional area of material. Specifically, the illustrated embodiment incorporates bore 310 through body 320 and base 330 to reduce the cross-section area, as shown in FIG. 3A. A most preferred embodiment of the present invention utilizes such bore to provide body sides having a cross-sectional material thickness in the range of approximately 0.2–0.4 mm.

Additionally or alternatively, embodiments of the present invention may utilize materials having a relatively low thermal conductivity, such as ceramics, plastics, glasses, and the like, in a mounting member of the present invention, or portions thereof, to impede the transmission of thermal energy therethrough. Additionally, any material utilized in mounting members of the present invention may be selected to provide a lowerest possible thermal conductivity coefficient, whether rising to the level of impeding the transfer of heat energy or not. However, the use of any of the above materials is preferably controlled by the coefficient of thermal expansion (CTE) considerations of the preferred embodiment discussed in detail below.

A preferred embodiment mounting member of the present invention utilized in providing mounting of a TEC stack-up with respect to an IBC LASER emitter subassembly is configured to include a base diameter of approximately 5 to approximately 7 mm, most preferably approximately 6.35 mm, and a body diameter of approximately 3 to approximately 7 mm, most preferably approximately 3.96 mm, having a bore of approximately 2.5 to approximately 6.5 mm, most preferably approximately 3.18 mm, disposed therein. Preferably, the base is approximately 0.3 to 0.7 mm, most preferably approximately 0.5 mm, in thickness while the body is approximately 0.2 to 0.4 mm, most preferably approximately 0.39 mm, in thickness. The length from the bottom of the base to the distal end of the body is preferably approximately 5 to 15 mm, most preferably 12 mm, with the cuts through the base and base end of the body extending approximately 1 to 3 mm, most preferably 2 mm from the bottom of the base and the cuts through the distal end of the body extending approximately 5 to approximately 9 mm, most preferably 7 mm, from the distal end of the body. Although dimensions with respect to a preferred embodiment of the present invention have been provided herein, it should be appreciated that the present invention is not limited to a mounting members embodying any or all such dimensions.

At least a slight pressure is preferably maintained at the interface between heat source component 210 and the hot surface of TEC 110 as well as at the interface between heat absorbing component 240 and the cool surface of TEC110 to facilitate conductance of thermal energy between the various surfaces. Accordingly, mounting members 250 of the preferred embodiment are deployed to provide compression of TEC stack-up 200 throughout the expected operating conditions thereof. For example, mounting members 250 preferably maintain substantially uniform pressure across the interface between heat source component 210 and the hot surface of TEC 110 and across the interface between heat absorbing component 240 and the cool surface of TEC 110. Moreover, the interface pressure maintained by mounting members 250 of the preferred embodiment is preferably substantially consistant throughout an expected range of operating temperatures.

Preferred embodiment mounting members 250 are comprised of a material selected at least in part as a function its CTE. Specifically, the CTE of the mounting members 250 is preferably selected as a function of the effective CTE of a corresponding portion of the stack-up for which the mounting member is to be used. According to a most preferred embodiment, a material from which a mounting member of the present invention is made is selected to have a CTE slightly higher than that of the effective CTE of the corresponding portion of the stack-up.

The CTE of mounting members 250 of a preferred embodiment of the present invention is selected to be slightly greater than the effective CTE of the components of TEC stack-up 200 disposed between the attachment points of mounting members 250 thereto. As will be discussed in further detail below, use of mounting member material having a CTE slightly greater than the effective CTE of corresponding components of a stack-up according to preferred embodiments of the present invention provides a compression interface between the components thereof which is relatively consistant throughout a range of operating temperatures.

Referring again to FIG. 2B, it can be seen that mounting members 250 are affixed to a surface of heat absorbing member 240 and to shared carrier 230 of heat source component 210. Accordingly, the CTE of mounting members 250 are preferably selected to be slightly higher than the effective CTE of TEC110. That is, the CTE of mounting members 250 is preferably selected to be slightly higher than the effective CTE of the combination of conductive plate 110, solid state material 121 and 122, and conductive plates 131 and 132.

In illustrating the selection of the CTE of mounting members 250 according to a preferred embodiment, it will be assumed that conductive plate 110 is comprised of a first material, such as alumina, having a first CTE ($CTE_1$) and a first thickness or height ($h_1$). Similarly, it will be assumed that solid state material 121 and 122 is comprised of a second material, such as bismuth-telluride, having a second CTE ($CTE_2$) and a second thickness or height ($h_2$). Finally, it will be assumed that conductive plates 131 and 132 are comprised of a third material, such as aluminum nitride, having a third CTE ($CTE_3$) and a third thickness or height ($h_3$). Accordingly, the effective CTE ($CTE_{eff}$) of TEC 110 may be determined as shown below:

$$CTE_{eff} = \frac{CTE_1 \cdot h_1 + CTE_2 \cdot h_2 + CTE_3 \cdot h_3}{h_1 + h_2 + h_3}$$

Where the materials of TEC 110 are selected as described above, the effective CTE may be calculated to be approximately 8, such as where aluminum nitride substrates are used, to approximately 10, such as where alumina substrates are used. According to a preferred embodiment of the present invention, the material from which mounting members 250 are made is selected to have a CTE slightly greater than 8 for TECs with aluminum nitride substrates and slightly greater than 10 for TECs with alumina substrates. Moreover, the material may preferably be selected to provide minimized thermal conductivity (heat leak), such as by selecting a material having relatively low thermal conductivity (K) and/or a material allowing a sufficiently strong member to be formed with a minimized cross-sectional area of the material (A), as discussed above. A preferred embodiment of the present invention utilizes mounting members comprised of Haynes Alloy 188, Haynes Alloy C276, or Haynes Alloy C4, all of which are available from Haynes International, Inc., Kokoma, Ind., which have been found to have a CTE of approximately 11 and provide satisfactory strength and heat leak characteristics when configured as described above. Of course, the present invention is not limited to mounting members comprised of the above materials. For example, alternative embodiments of the present invention may utilize mounting members comprised alloys such as Titanium IMI834 or Allegheny Ludlum AL 276, which have also been found to have a CTE in the range useful with respect to the above described TEC configurations.

It should be appreciated that how closely the CTE of a mounting member of the present invention matches the effective CTE of corresponding structure may be a function of several considerations. For example, in order to keep manufacturing costs at a minimum, it may be advantageous to select a readily available material, such as the above mentioned Haynes Alloy 188 or Haynes Alloy C276, having a CTE acceptably above, such as on the order of less than 10%, the effective CTE rather than producing an alloy to provide a specific CTE. Accordingly, assuming the effective CTE is calculated to be 10, materials having a CTE from 10 to approximately 12 may be considered as candidates for forming mounting members of a preferred embodiment. However, particular situations may demand a mounting member CTE more closely matching the effective CTE of corresponding structure. For example, where the material of particular components of the stack-up, such as shared carrier 230 and/or semiconductor material 121 and 122, are rigid (inflexible) and/or disposed in a configuration particularly susceptible to fracturing under stress, it may be desirable to select a material for mounting members 250 more closely matching the effective CTE of the corresponding structure.

In order to provide a compression interface throughout a range of expected operating temperatures according to a preferred embodiment of the present invention, mounting members 250 are preferably affixed with respect to TEC stack-up 200 at a temperature outside of the expected operating range of TEC stack-up 200. For example, Bellcore sets forth performance criteria for systems utilized in the telecommunications industry requiring such systems to perform reliably throughout a wide range of operating temperatures, such as from−40° C. to +125° C. Accordingly, it may be expected that a system implementing the present invention which is to be deployed in a particular telecommunications application may be exposed to temperatures ranging from−40° C. to+125° C. Therefore, a preferred embodiment of the present invention affixes mounting members to shared carrier 230 and heat absorbing component 240 at a temperature greater than+125° C.

For example, during assembly of TEC stack-up 200, the assembly may be heated to a temperature above+125° C., such as approximately+180° C., and mounting members 250 attached, such as by soldering or welding, to shared carrier 230 and heat absorbing component 240. Thereafter, as TEC stack-up 200 cools, compression interfacing of the hot surface of TEC 110 with heat source component 210 and of the cool surface of TEC 110 with heat absorbing component 240 is assured. Specifically, as the CTE of mounting members 250 is slightly greater than the effective CTE of corresponding structure of TEC stack-up 200 disposed in the stack-up between the mounting member attachment points, as the assembly cools shrinkage of mounting members 250 will be slightly greater than that of TEC110 causing heat source component 210 and heat absorbing component 240 to be drawn together. For example, having a CTE of approximately 12 may result in mounting members 250 contracting in length by approximately 5.5 microns when cooled from the affixing temperature of+180° C. to a normal operating temperature, such as+85C., while TEC 110, having an effective CTE of approximately 10, may contract in height by approximately 4.2 microns when cooled by the same amount.

Upon cooling to temperatures within the range of expected operating temperatures, TEC 110 will be slightly compressed between heat source component 210 and heat absorbing component 240, assuming of course a reasonably tight interface was initially provided when the mounting members were affixed. As the mounting members of the preferred embodiment are affixed to the stack-up at a higher temperature than the highest temperature of the expected operating range, it should be appreciated that the compression interfacing provided by the mounting members will be present at all operating temperatures. Accordingly, the illustrated embodiment TEC stack-up configuration may be relied upon to provide a sufficient interface to provide desired temperature control throughout a range of operating temperatures and in a structure which is configured to withstand expected dynamic forces.

Of course, it should be appreciated that the present invention is not limited to use in TEC stack-ups and, therefore, may be utilized in providing other laminated structures. Moreover, the present invention is not limited to use in providing compressive interfaces as described herein. For example, mounting members of the present invention may be selected to have a slightly less CTE than corresponding structure or affix the structure at a temperature that is lower than the minimum environment temperature in order to provide a configuration in which a compressive interface is not desired.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A mounting member for use in a laminated structure, said mounting member comprising:
   a body comprised of a material selected to provide a coefficient of thermal expansion (CTE) selected as a function of al effective coefficient of channel expansion ($CTE_{eff}$) of a corresponding portion of said laminated structure, wherein said body Comprises a bore disposed longitudinally through said body to thereby provide a reduced cross-sectional area of said material; and
   at least one expansion score disposed in a distal end of said body, wherein said at least one expansion score is adapted to extend beyond an interface of said mounting member and an attachment point of said laminated structure.

2. The mounting member of claim 1, wherein said CTE is greater than said $CTE_{eff}$.

3. The mounting member of claim 2, wherein said CTE is selected to be within approximately 20% of said $CTE_{eff}$.

4. The mounting member of claim 1, wherein said body comprises a means for minimizing heat leak within said laminated structure.

5. The mounting member of claim 1, wherein said body comprises said material that possesses a relatively low thermal conductivity.

6. The mounting member of claim 1, wherein said attachment point comprises a pass-through attachment and said at least one expansion score extends above and below said pass-through attachment.

7. The mounting member of claim 1, wherein said at least one expansion score comprises a cut extending completely through a portion of said material.

8. The mounting member of claim 1, further comprising: a base, wherein said base is disposed at an end of said body.

9. The mounting member of claim 8, further comprising: at least one expansion score disposed in said base.

10. The mounting member of claim 8, wherein said base provides a relatively stable surface mount interface for said mounting member.

11. The mounting member of claim 8, wherein said body has a first diameter and said base has a second diameter, wherein said first diameter is less than said second diameter.

12. The mounting member of claim 11, wherein said first diameter is in the range of approximately 3–6 mm and said second diameter is in the range of approximately 5–7 mm.

13. The mounting member of claim 11, wherein said first diameter is approximately 4 mm and said second diameter is approximately 6 mm.

14. The mounting member of claim 12, wherein a cross-sectional thickness of said material in said body is in the range of approximately 0.2–0.4 mm.

15. A system for providing reliable thermoelectric cooling throughout a range of operating temperatures, said system comprising:
- a heat source component;
- a heat absorbing component;
- a thermoelectric cooler disposed between said heat source component and said heat absorbing component; and
- a mounting member coupled to said heat source component and said heat absorbing component, wherein said mounting member is comprised of a material having a coefficient of thermal expansion that is greater than an effective coefficient of thermal expansion of said thermoelectric cooler.

16. The system of claim 15, wherein at least a portion of said heat source component is cantilevered beyond said thermoelectric cooler, and wherein said mounting member is coupled to said heat source component at said cantilevered portion.

17. The system of claim 16, wherein said heat source component comprises an IBC LASER assembly.

18. The system of claim 17, wherein said heat absorbing component comprises a case assembly.

19. The system of claim 16, wherein said heat source component presents a footprint substantially larger than a footprint of said thermoelectric cooler.

20. The system of claim 16, wherein said mounting member is coupled to said heat source component at a point that minimizes stress experienced by said thermoelectric cooler.

21. The system of claim 20, wherein said point is a center of gravity associated with said heat source component.

22. The system of claim 15, wherein said coefficient of thermal expansion of said mounting member is selected to be within approximately 20% of said effective coefficient of thermal expansion.

23. The system of claim 15, wherein said effective coefficient of thermal expansion is in the range of approximately 8–10.

24. The system of claim 15, wherein said coefficient of thermal expansion is approximately 11.

25. The system of claim 15, wherein said mounting member comprises a means for minimizing heat leak between said heat absorbing component and said heat source component.

26. The system of claim 15, wherein said mounting member comprises a bore disposed longitudinally through said mounting member to thereby provide a reduced cross-sectional area of said material.

27. The system of claim 15, wherein said mounting member comprises said material that possesses reduced thermal conductivity.

28. The system of claim 15, further comprising:
- at least one expansion score disposed in a distal end of said mounting member, wherein said at least one expansion score is adapted to extend beyond an interface of said mounting member and an attachment point of at least one of said heat source component and said heat absorbing component.

29. The system of claim 28, wherein said attachment point comprises a pass-through attachment and said at least one expansion score extends above and below said pass-through attachment.

30. The system of claim 28, wherein said at least one expansion score comprises a cut extending completely through a portion of said material.

31. The system of claim 15, wherein said mounting member comprises:
- a body; and
- a base, wherein said base is disposed at an end of said body.

32. The system of claim 31, wherein a cross-sectional thickness of said material in said body is in the range of approximately 0.2–0.4 mm.

33. The system of claim 31, further comprising:
- at least one expansion score disposed in said base.

34. The system of claim 31, wherein said base provides a relatively stable surface mount interface for said mounting member.

35. The system of claim 31, wherein said body has a first diameter and said base has a second diameter, wherein said first diameter is less than said second diameter.

36. The system of claim 35, wherein said first diameter is in the range of approximately 3–6 mm and said second diameter is in the range of approximately 5–7 mm.

37. A method for providing a laminated structure, said method comprising:
- selecting components for strata of said laminated structure;
- identifying attachment points for a mounting member to retain said strata as said laminated structure;
- determining an effective coefficient of thermal expansion associated with said selected components to be disposed in strata of said laminated structure between said attachment points;
- providing a mounting member, wherein said mounting member consists of a material that has a coefficient of thermal expansion that is greater than said effective thermal coefficient of expansion; and
- attaching said mounting member to said mounting points to provide said laminated structure, wherein said mounting member is attached to said attachment points while said mounting member and said components of said strata are at a temperature outside of an expected range of operating temperatures of said laminated structure.

38. The method of claim 37, wherein identifying said components of said laminated structure comprises a heat source component, a heat absorbing component, a thermoelectric cooler.

39. The method of claim 37, wherein identifying said attachment points for said mounting member comprises:
- determining center of gravity information with respect to at least one of said components.

40. The method of claim 37, wherein said determining said effective coefficient of thermal expansion comprises:
   determining a coefficient of thermal expansion associated with portions of at least one said component; and
   determining a weighting value associated with each said portion.

41. The method of claim 40, wherein said weighting value comprises a height associated with each said portion.

42. The method of claim 37, wherein said effective coefficient of thermal expansion is determined to be in the range of approximately 8–10 and said material is selected to have a coefficient of thermal expansion of approximately 12.

43. The method of claim 37, wherein said material of said mounting member is further selected to have a relatively low thermal conductance.

44. The method of claim 37, wherein said mounting member comprises a body having a bore disposed therein.

45. The method of claim 37, wherein said attaching said mounting member comprises:
   passing a distal end of said mounting member through a component of a first strata of said laminated structure.

46. The method of claim 45, wherein said attaching said mounting member comprises:
   coupling an attachment member to said distal end of said mounting member passed through said component.

47. The method of claim 45, wherein said attaching said mounting member comprises:
   soldering said distal end of said mounting member passed through said component.

48. The method of claim 45, further comprising:
   providing a cut through the material of said distal end of said mounting member to minimize stress experienced by said component.

49. The method of claim 45, wherein said attaching said mounting member comprises:
   attaching a base of said mounting member to a second strata of said laminated structure.

50. A method of assembling a device that includes a thermoelectric cooler, comprising:
   providing a first thermally conductive layer and a second thermally conductive layer;
   placing said thermoelectric cooler between said first and second thermally conductive layers, wherein said thermoelectric cooler, said first thermally conductive layer, and said second thermally conductive layer possess an effective coefficient of thermal expansion (CTE);
   heating said thermoelectric cooler, said first thermally conductive layer, and said second thermally conductive layer to an assembly temperature that is above an expected operating temperature of said device; and
   while said thermoelectric cooler, said first thermally conductive layer, and said second thermally conductive layer are at said assembly temperature, mechanically coupling a mounting member to both of said first thermally conductive layer and said second conductive layer so as to cause a compression force to be applied to said thermoelectric cooler, wherein said mounting member possesses a CTE that is greater than said effective CTE.

51. The method of claim 50 further comprising:
   mounting a heat generating component to said first thermally conductive layer.

52. The method of claim 51 wherein said heat generating component is an IBC laser assembly.

53. The method of claim 51 wherein said heat generating component is attached to said first thermally conductive layer such that thermoelectric cooler supports the center of gravity associated with said heat generating component.

54. The method of claim 50 wherein said mechanically coupling comprises inserting a distal end of said mounting member through an aperture of said first conductive layer.

55. The method of claim 54 wherein said mounting member comprises at least one score running longitudinally from said distal end, wherein said at least one score is operable to permit said mounting member to expand and contract in response to changes in temperature when said mounting member is mechanically coupled to said first layer.

56. The method of claim 50 wherein said CTE of said mounting members is within 20% of said effective CTE.

* * * * *

UNITED STATES PATENT AND TRADEMARK OFFICE
CERTIFICATE OF CORRECTION

PATENT NO.    : 6,519,157 B1
DATED         : February 11, 2003
INVENTOR(S)   : Andrew Xing It is certified that error appears in the above-identified patent and that said Letters Patent is hereby corrected as shown below:

Column 4,
Line 64, delete "TEC 110" and insert -- TEC 100 --

Column 5,
Lines 12, 25 and 62, delete "TEC 110" and insert -- TEC 100 --

Column 6,
Line 26, 35 and 41, delete "TEC 110" and insert -- TEC 100 --

Column 9,
Lines 39, 40, 48 and 49, delete "TEC 110" and insert -- TEC 100 --

Column 10,
Lines 14 and 36, delete "TEC 110" and insert -- TEC 100 --

Column 11,
Lines 43, 44, 50, 56 and 61, delete "TEC 110" and insert -- TEC 100 --

Column 12,
Line 44, delete "al" and insert -- an --

Column 14,
Line 60, delete "wherein identifying said" and insert -- wherein said --
Line 61, delete "comprises" and insert -- comprise --

Signed and Sealed this

Twelfth Day of August, 2003

JAMES E. ROGAN
*Director of the United States Patent and Trademark Office*